United States Patent [19]

Riley et al.

[11] Patent Number: 5,781,044
[45] Date of Patent: Jul. 14, 1998

[54] DELTA-SIGMA FRACTIONAL-N FREQUENCY SYNTHESIZER AND FREQUENCY DISCRIMINATOR SUITABLE FOR USE THEREIN

[75] Inventors: Thomas A. D. Riley, Osgoode; Miles A. Copeland, Ottawa, both of Canada

[73] Assignee: Northern Telecom Limited, Brampton, Canada

[21] Appl. No.: 737,370

[22] PCT Filed: May 12, 1995

[86] PCT No.: PCT/CA95/00271

§ 371 Date: Nov. 8, 1996

§ 102(e) Date: Nov. 8, 1996

[87] PCT Pub. No.: WO95/31861

PCT Pub. Date: Nov. 23, 1995

[30] Foreign Application Priority Data

May 12, 1994 [CA] Canada .................. 2123477

[51] Int. Cl.⁶ .................................. H03B 21/00
[52] U.S. Cl. ............. 327/105; 327/107; 327/150; 327/159
[58] Field of Search ................... 327/105, 107, 327/147, 149, 150, 156, 158, 159, 113, 114

[56] References Cited

U.S. PATENT DOCUMENTS

| | | | |
|---|---|---|---|
| 4,580,107 | 4/1986 | Caldwell et al. | 331/10 |
| 4,810,974 | 3/1989 | Hulbert et al. | 331/1 A |
| 5,173,665 | 12/1992 | Norimatsu | 331/25 |
| 5,258,724 | 11/1993 | Tanis et al. | 331/1 A |
| 5,329,253 | 7/1994 | Ichihara | 331/17 |
| 5,552,750 | 9/1996 | Barrett, Jr. et al. | 331/25 |
| 5,563,535 | 10/1996 | Corry et al. | 327/105 |
| 5,630,222 | 5/1997 | Barrett, Jr. et al. | 455/260 |

FOREIGN PATENT DOCUMENTS

| | | | |
|---|---|---|---|
| 0 077 589 | 10/1952 | European Pat. Off. | H03L 7/18 |
| 0 402 113 | 6/1990 | European Pat. Off. | H03L 7/093 |

OTHER PUBLICATIONS

*An Oversampling Delta-Sigma Frequency Discriminator*, by R. Douglas Beards and Miles A. Copeland IEEE Transactions on Circuits and Systems—II: Analog and Digital Signal Processing, vol. 41, No. 1, Jan. 1994.

*Primary Examiner*—David C. Nelms
*Assistant Examiner*—Hein Nguyen
*Attorney, Agent, or Firm*—Thomas Adams

[57] ABSTRACT

A fractional-N frequency synthesizer comprises a voltage-controlled oscillator (107) for generating an output signal ($F_o$) in response to a control voltage derived by a digital-to-analog converter (105) from a digital error signal (e). The error signal is derived by a differencing device (103) which subtracts a digital signal ($D_o$) representing the actuated frequency of the output signal from an input signal ($F_d$) having the desired frequency for the output signal. The digital signal representing the output signal frequency is derived by a frequency discrimination device (101) which determines the instant frequency of the analog output signal and provides a corresponding digital representation with zero static frequency error. In preferred embodiments, the frequency discrimination device is a delta-sigma frequency synthesizer in combination with a decimator (102). This frequency synthesizer configuration avoids deficiencies due to non-linearity and noise sensitivity of analog phase detectors. The invention also provides a frequency discriminator (101') comprising a feedforward path including a multimodulus divider (201) for dividing the frequency of a digital signal ($F_o$) in dependence upon a division ratio control signal, comparison (202) for comparing the divided frequency signal with a reference frequency signal ($F_{ref}$) to provide an error signal, and a feedback path comprising a circuit having a transfer function of $2-Z^{-1}$ and responsive to the error signal and the reference frequency signal to provide the division ratio control signal.

23 Claims, 6 Drawing Sheets

DELTA-SIGMA FRACTIONAL-N FREQUENCY SYNTHESIZER AND FREQUENCY DISCRIMINATOR SUITABLE FOR USE THEREIN

This application is a 371 of PCT/CA95/00271.

TECHNICAL FIELD

The invention relates to frequency synthesizers and especially fractional-N frequency synthesizers. The invention also relates to frequency discriminators especially suitable for use in such frequency synthesizers.

BACKGROUND ART

Known fractional-N frequency synthesizers, such as that disclosed in U.S. Pat. No. 4,965,531, use an analog phase detector to detect the error signal or difference between the frequency being generated and a desired frequency. Such frequency synthesizers are not entirely satisfactory because analog phase detectors are not perfectly linear, can be a source of noise, and can themselves be sensitive to noise/interference.

U.S. Pat. No. 4,810,974 discloses a voltage controlled oscillator intended for periodically compensating the effects of temperature and aging. It comprises a single loop with an analog phase/frequency comparator and uses an integer divider to generate output frequencies which are integer multiples of a reference frequency.

DISCLOSURE OF THE INVENTION

According to one aspect of the invention, there is provided a fractional-N synthesizer comprising a voltage controlled oscillator responsive to a control voltage ($V_c$) to generate an output signal ($F_o$) having a particular frequency, frequency discriminator means responsive to the output signal ($F_o$) and a reference signal ($F_{ref}$) having a predetermined reference frequency to generate a digital signal ($D_o$) representing the output signal frequency, differencing means responsive to the digital representation signal and to a digital input signal representing a desired output frequency ($F_d$) to provide an error signal (e), and digital-to-analog conversion means for converting the error signal to provide said control voltage ($V_c$), the frequency discriminator means comprising a phase-locked loop means phase-locked to the output signal ($F_o$).

With such a configuration, the combined transfer function of the frequency synthesizer can be such that quantization noise generated by the frequency discriminator is substantially eliminated from the output signal ($F_o$).

Preferably, filter means is provided between the digital-to-analog conversion means and the voltage controlled oscillator. This filter means may comprise an analog integrator and remove some quantization noise.

Filter means may be provided between the differencing means and the digital-to-analog conversion means. This filter means may comprise a digital integrator such that the output signal frequency ($F_o$) is phased locked to the reference signal frequency ($F_{ref}$).

Where both the first-mentioned filter means and the second-mentioned filter means are included, a stabilizing zero means will generally be included to ensure stability of the frequency synthesizer circuit. The stabilizing zero means may comprise a feed forward loop and summing means provided in one of the filter means, conveniently that provided between the differencing means and the digital-to-analog conversion means.

The frequency discrimination means may comprise a frequency discriminator connected to receive the output signal from the voltage-controlled oscillator and decimation filter provided between the output of the frequency discriminator and the differencing means. The decimation filter will reduce the sampling rate of the frequency discriminator, for example from 10 MHz to 1 MHz, contributing, in the process, to reduction of quantization noise.

The frequency discrimination means may comprise a frequency discriminator comprising a feedforward path including a multimodulus divider means for dividing the frequency of the output signal ($F_o$) in dependence upon a division ratio control signal, comparison means for comparing the divided signal with the reference signal to provide a second error signal, and a feedback path comprising a circuit having a transfer function of $2-Z^{-1}$ and responsive to the error signal and the reference signal to provide the division ratio control signal.

The fractional-N synthesizer may further comprise a first filter means in a signal path between the differencing means and the digital-to-analog conversion means, a second filter means having its output connected to supply the digital-to-analog converter means, and input means for applying a modulation signal to respective inputs of the first and second filter means, the first and second filter means having respective transfer functions such that modulation of the output signal of the fractional-N synthesizer in response to the modulation signal is possible for modulation rates above a loop bandwidth of the fractional-N synthesizer.

Where such a modulation signal is employed, the digital-to-analog converter may be adjustable to vary amplification of a converted signal in response to a gain control signal, the fractional-N synthesizer further comprising means responsive to the modulation signal and to a residual error signal derived as a difference between the modulation signal and the error signal, to provide the gain control signal, the arrangement being such that variations in gain of the voltage controlled oscillator are offset by compensating variations in the gain of the digital-to-analog converter.

According to a second aspect of the invention, there is provided a frequency discriminator comprising a feedforward path including a multimodulus divider means for dividing the frequency of a digital signal ($F_o$) in dependence upon a division ratio control signal, comparison means for comparing the divided frequency signal with a reference frequency signal to provide an error signal, and a feedback path comprising a transfer function of $2-Z^{-1}$ and responsive to the error signal and the reference frequency signal to provide the division ratio control signal.

In preferred embodiments of either of the first and second aspects of the invention, the frequency discrimination means may comprise a feedforward path including multimodulus divider and delay line means for dividing the frequency of a digital signal ($F_o$) in dependence upon a division ratio control signal ($b_1$) and delaying the resulting signal to provide a first divided signal ($x_c$), at least one leading divided signal leading the first divided signal and at least one lagging divided signal lagging the first divided signal;

comparison means for comparing the first divided signal ($x_c$) with a reference signal ($F_{ref}$) and providing said division ratio control signal ($b_1$);

selection means for selecting, alternatively, the leading divided signal and the lagging divided signal in dependence upon a signal applied to a selection control input of the selection means;

phase detection means for measuring phase error between the selected signal ($x_c$) and the reference signal ($F_{ref}$) and providing a corresponding phase error signal;

integrator means for integrating the phase error signal;

quantizing means for quantizing the integrated phase error signal to provide a quantized signal representing error in the division ratio control signal ($b_1$), the quantized signal being applied to said selection control input; and output means for deriving a derivative of the quantized signal and combining the quantized signal derivative and the division ratio control signal for output from the frequency discriminator.

The multimodulus divider and delay line means may provide a second leading signal and a second lagging signal, the selection means have a second control input, the selection means selecting one of the leading signals and lagging signals in dependence upon the state of signals at both of the first and second control inputs; the integration means comprise first and second integrators in series; the frequency discriminator further comprise delay means for delaying the integrated phase error signal and applying the delayed integrated phase control signal to the second control input of the selection means; the output means, with the delay means, serving to differentiate the integrated phase error signal (b2) and combine the differentiated signal with the delayed phase error signal and the division ratio control signal.

In embodiments of any of the foregoing aspects of the invention, the multi-modulus divider means may comprise a programmable multi-modulus divider capable of dividing by n or n+δ where δ is a fractional value less than unity.

BRIEF DESCRIPTION OF DRAWINGS:

The various objects, features, aspects and advantages of the present invention will become more apparent from the following detailed description of embodiments of the invention taken in conjunction with the accompanying drawings in which:

FIG. 3b is a timing diagram for the frequency discriminator of FIG. 3a;

Figure 1:
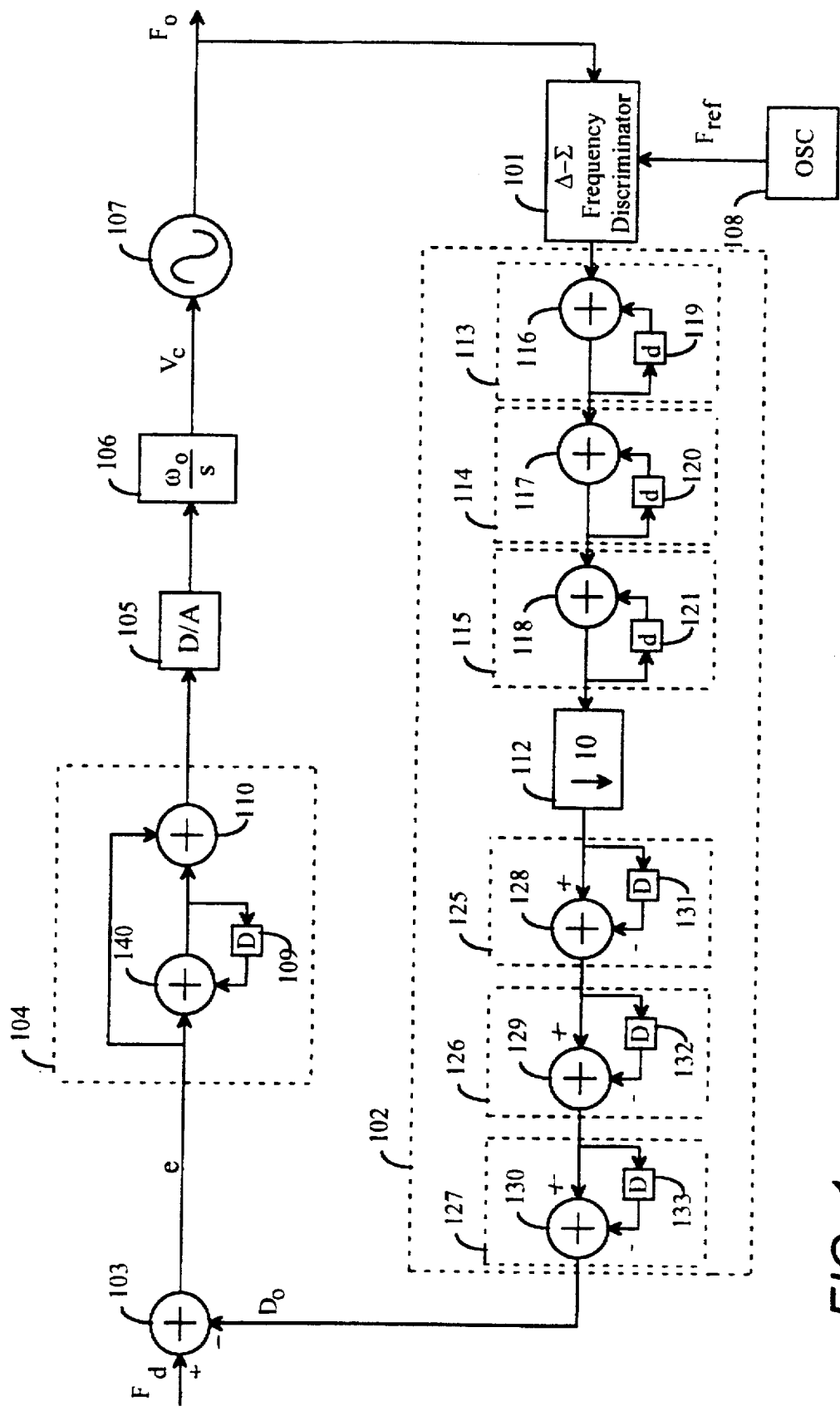
FIG. 1 illustrates a digital frequency synthesizer according to one aspect of the invention.

MODE(S) FOR CARRYING OUT THE INVENTION:

Referring first to FIG. 1, a frequency synthesizer comprises differencing means in the form of a subtracter 103, which receives at its "plus" input a ten bit digital word representing a desired frequency ($F_d$) which the frequency synthesizer is required to generate. At its "minus" input, the differencing means 103 receives a digital signal $D_o$ representing the actual output frequency of the frequency synthesizer derived in a manner which will become apparent later. This digital signal is a ten bit word. The output of the differencing means 103, i.e. the error signal e, also ten bit word, is applied via a filter 104 to the input of a twelve bit digital-to-analog convertor 105. The digital-to-analog convertor 105 converts the twelve bit word to a corresponding control voltage $V_c$ and applies it via an analog filter 106 to the control input of a voltage controlled oscillator 107. A suitable voltage controlled oscillator 107 is available as part No. VCO-P-800 from Synergy Microwave Inc. The output of the voltage controlled oscillator 107 is the output signal ($F_o$) of the frequency synthesizer and has a frequency of about 800 MHz. This output signal $F_o$ also is applied to one input of frequency discrimination means comprising a frequency discriminator 101 and decimation means 102. A reference signal $F_{ref}$ which has a frequency of 10 MHz, is applied to a reference input of the frequency discriminator 101. The drawing shows the reference signal $F_{ref}$ emanating from a crystal oscillator 108. It will be appreciated, however, that any suitable source could be used and could be internal to the frequency discriminator 101. The output of the frequency discriminator 101 is a bitstream, the density of the ones representing the output frequency $F_o$. This bitstream from the frequency discriminator 101 is supplied to decimation filter 102 which converts it to ten bit words at a rate of 1 MHz, in the process contributing to quantization noise reduction. The output of the decimation filter 102 is the digital signal $D_o$, representing the measured output frequency, which is applied to the "minus" input of differencing means 103.

The transfer functions of the various components are selected so that the complete loop constitutes a phased locked loop with a bandwidth of around 50 KHz. The transfer functions of the three filters and the other components in the circuit all contribute towards a combined or overall circuit transfer function which reduces quantization noise created by the frequency discriminator 101 to an acceptable level in the control voltage $V_c$ and hence in the phase error of the output signal $F_o$.

While various kinds of filter can be used, the specific embodiment uses an analog filter 106 is represented as an analog integrator $\omega_o/s$ providing a one volt output to the VCO 107.

The filter 104 comprises an integrator formed by a summing device 140 and delay 109. The delay 109 is connected between the output of the summing device 140 and one of its inputs. The output of differencing means 103 is applied to the other input of summing device 140 and an input of a second summing device 110, the other input of which receives the output of first summing device 140. The output of the second summing device 110 is the output of the filter 104. The second summing means 110 provides a stabilization zero for the circuit transfer function to ensure stability of the phase locked loop.

The decimation filter 102 comprises a down-sampling device 112 for downsampling by a factor of ten the bitstream received from the frequency discriminator 101. Three integrators 113, 114 and 115 are connected in series between the input of the decimation filter 102 and the input of the down-sampling device 112. The integrators 113, 114 and 115 comprise summing devices 116, 117 and 118, respectively and delays 119, 120 and 121, respectively. Each of the delays 119, 120, and 121 is a ten bit delay. The first in the series, integrator 113, merely receives the bitstream which constitutes the least significant bit. The other two integrators 114 and 115 function as full ten bit adders. These are of course functioning at the bit rate of 10 MHz.

Three differentiators 125, 126 and 127 are connected in series after the downsampling device 112. The differentiators 125, 126 and 127 comprise first, second and third adders 128, 129 and 130 with delay means 131, 132 and 133, respectively, connected in feedforward loops between their "plus" and "minus" inputs. These adders 128, 129 and 130 and delays 131, 132 and 133 also are ten bit capacity, but in this case operating at the lower clock rate of 1 MHz. For further information about the construction and operation of this kind of decimation filter 102 the reader is directed to the article "Decimation for Sigma-Delta Modulation", IEEE Transactions on Communications, Vol. 34, No. 1, January 1986, pp 72–76, the entire contents of which are incorporated herein by reference.

For details of a suitable phase-locked loop frequency discriminator, the reader is directed to an article by R. D. Beards and M. A. Copeland entitled "An Oversampling Delta-Sigma Frequency Discriminator" IEEE Transactions on Circuits and Systems Part II Analog and Digital Signal Processing, January 1994, Vol. 41, No. 1 pp 26–32, which is incorporated herein by reference. The frequency discriminator disclosed by Beards and Copeland is particularly suitable because it ensures that the quantization error introduced by the discriminator is spectrally shaped so as to be acceptably low close to DC and multiples of the reference frequency $F_{ref}$.

While the frequency discriminator 101 provides a single bit bitstream, it would be possible to use a frequency discriminator which supplied a series of digital words comprising 2, 3 or 4 bits to represent the frequency of the output signal, providing it did so with substantially zero static frequency error.

Although the discriminator disclosed by Beards and Copeland is preferred, other discriminators are viable. For example, the discriminator could provide a continuous time zero in the feedforward loop of the discriminator. Alternatively, the discriminator could be a third order discriminator. It is also envisaged that the frequency discriminator might provide a transfer function of $2-Z^{-1}$ in its feedback loop. Such a frequency discriminator is shown in FIG. 2 and referenced 101'.

Figure 2:
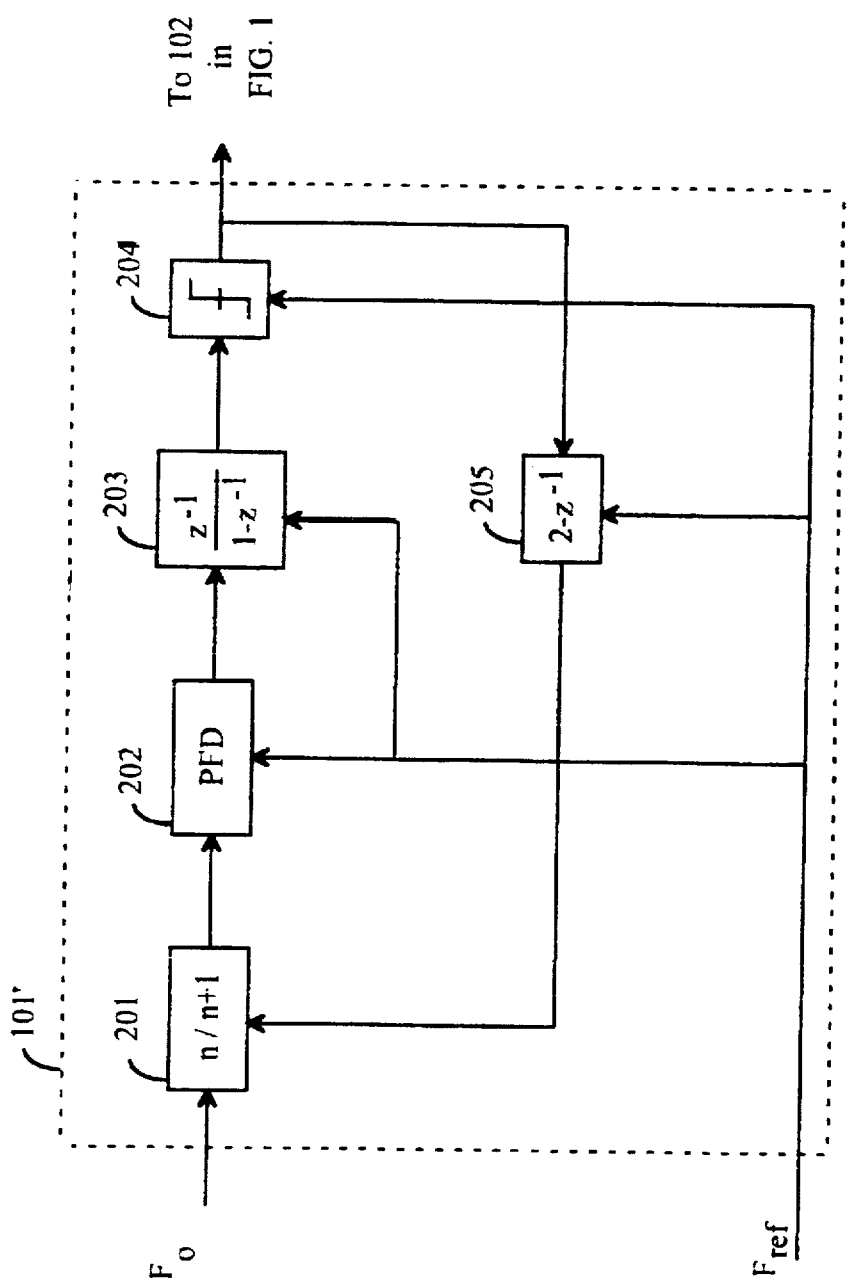
FIG. 2 illustrates a frequency discriminator of the frequency synthesizer and in accordance with a second aspect of the invention.

Referring now to FIG. 2, in the frequency discriminator 101', the output signal $F_o$ (from the VCO 107) is applied to a multimodulus divider 201 which divides it by either n, n+1, n+2 or n+3 in dependence upon a division control signal from circuit 205 which provides the transfer function $2-z^{-1}$ where $z^{-1}$ is a delay operator. The divider 201 provides a divided frequency signal comprising a sequence of digital words at the 10 MHz bit rate and applies it to a phase/frequency detector 202. The phase frequency detector 202 compares the 10 MHz divided frequency signal with the reference frequency signal $F_{ref}$ to provide a secondary signal which is applied to integrator 203, which is a discrete time integrator clocked by the reference signal $F_{ref}$. Alternatively, integrator 203 could be a continuous time integrator which need not be clocked. The integrated divided signal from the output of integrator 203 is sampled by quantizer 204 to provide the 1 bit bitstream for supply to decimator 102 (FIG. 1). The output of quantizer 204 is also supplied to transfer function circuit 205 which also is clocked by the reference signal $F_{ref}$.

Figure 3A:
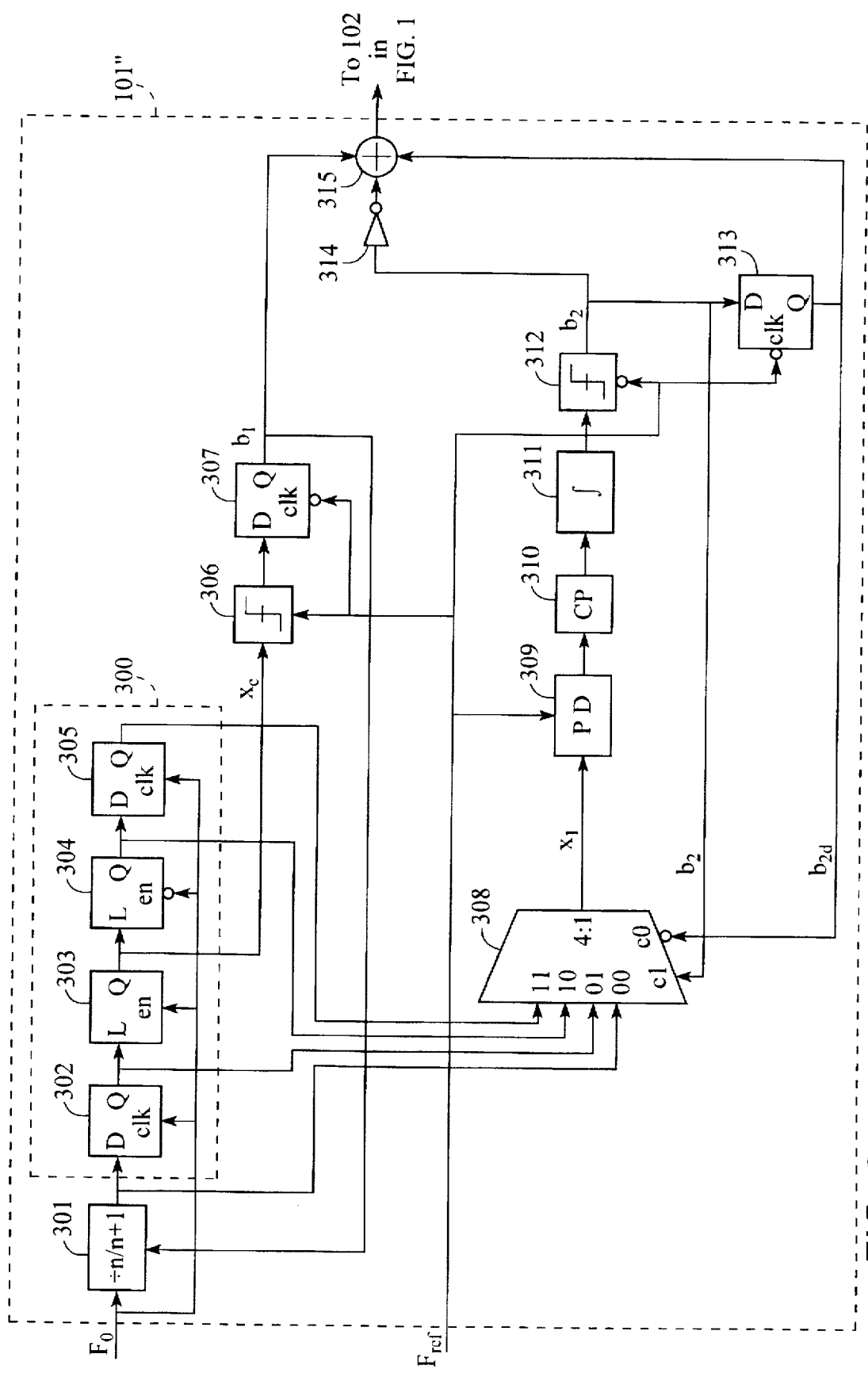
FIG. 3a illustrates an alternative frequency discriminator in accordance with a third aspect of the invention.
Figure 3B:
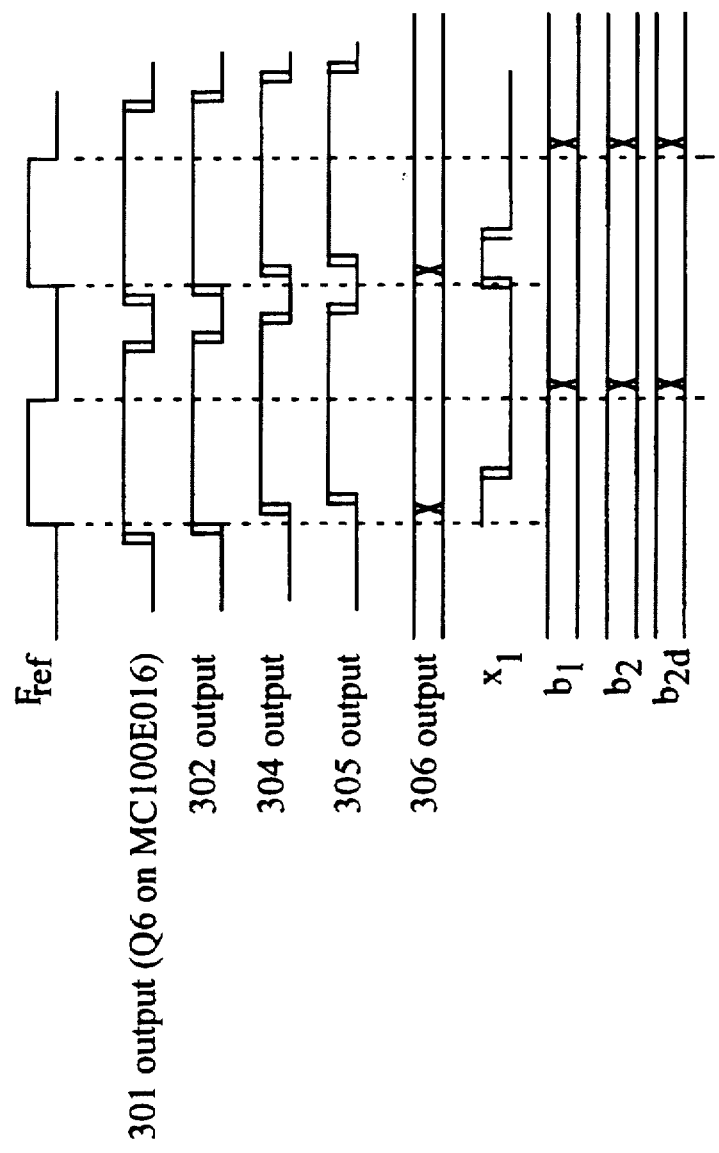

FIG. 3a illustrates a delta-sigma discriminator 101" which uses third order noise shaping to produce less noise at lower frequencies than the discriminators 101 and 101' of FIGS. 1 and 2, and FIG. 3b is its timing diagram. The discriminator 101" shown in FIG. 3a comprises a dual modulus divider 301 which divides the signal $F_o$ by n or n+1 in independence upon a division ratio control signal $b_1$. The output of divider 301 is supplied to a tapped delay line 300 which comprises, in series, a first D-type flip-flop 302, a first latch 303, a second latch, and a second D-type flip-flop 305, all clocked by the signal $F_o$. Each D-type flip-flop responds to the rising edge of the signal $F_o$ and provides a delay of one clock cycle. Each latch provides a delay of one half clock cycle. Latch 303 is "enabled" so as to be transparent when the signal $F_o$ is high, whereas latch 304 has an inverting ENABLE input so that it is transparent when the signal $F_o$ is low.

The centre tap of tapped delay line 300, i.e. the output of latch 303, is connected to the input of a lead/lag phase comparator 306 which determines at the time of the rising edge of reference signal $F_{ref}$ (see FIG. 3b), whether or not the delayed divided signal $x_c$ from the centre tap leads or lags the reference signal $F_{ref}$. A D-type flip-flop 307 connected to the output of comparator 306 has an inverting clock input to receive reference signal $F_{ref}$ so that its output changes after the falling edge of reference signal $F_{ref}$ as indicated in FIG. 3b. The D-type flip-flop 307 delays the output of phase comparator 306 by one half of the clock cycle to provide the division ratio control signal $b_1$ as a digital bitstream.

If delayed division signal $x_c$ leads the reference signal $F_{ref}$ by an excessive phase difference, the number of ones in the division ratio control signal $b_1$ will be relatively high. As a result, the higher division ratio will be selected more often, thereby reducing the phase difference. Conversely, if and when the delayed division signal $x_c$ lags reference signal $F_{ref}$ by a significant phase difference, there will be fewer ones in division control signal $b_1$ causing the lower division ratio to be selected more often, and thereby increasing the phase difference.

The output of divider 301 and the three remaining outputs of tapped delay line 300, i.e. from delays 302, 304, and 305, are supplied to a 4:1 multiplexer 308. The signals from divider 301 and delay 302 lead the signal $x_c$ and are supplied to inputs 00 and 01 respectively, of multiplexer 308. The signal from delays 304 and 305 lag the signal $x_c$ and are supplied to inputs 10 and 11 of multiplexer 308. The multiplexer 308 has two control inputs c0 and c1. When the state of the signal at control input c1 is high (1), the multiplexer 308 will select one or other of its inputs 10 and 11 depending upon the state of the signal at control input c0. On the other hand, when the state of the signal at control input c1 is low (0), the multiplexer 308 will select one or other of its inputs 00 and 01, again depending upon the state of the signal at control input c0.

A phase detector 309 compares the selected output $x_1$ of multiplexer 308 with reference signal $F_{ref}$. Control input c0 is the least significant bit (LSB) control input of multiplexer 308 and control input c1 is the most significant bit (MSB) control input of multiplexer 308. The output of phase detector 309 is integrated by a first integrator 310 and then the output of integrator 310 integrated by a second integrator 311. The first integrator 310 may be a charge pump because it switches current under the control of the phase detector 309, whereas integrator 311 preferably is a continuous-time or discrete-time (sample-data) integrator because its input is the varying voltage from integrator 310.

The output of integrator 311 is supplied to a second comparator 312 which has an inverting clock input to receive the reference signal $F_{ref}$. The second comparator 312 acts as a quantizer to quantize the output of integrator 311 on the inverted phase of the signal $F_{ref}$ to produce a second digital bitstream $b_2$. A D-type flip-flop 313, also clocked on the inverted phase of reference signal $F_{ref}$, delays bitstream $b_2$ by one cycle (with respect to the period of bitstream $b_2$) and supplies the delayed bitstream $b_{2d}$ to the control input c0 of multiplexer 308 after the falling edge of reference signal $F_{ref}$ as indicated in FIG. 3b. The original bitstream $b_2$ from the output of comparative 312 is supplied directly to control input c1 of multiplexer 308.

An inverter 314 inverts the bitstream $b_2$ and supplies it to a summing device 315 which sums it with the bitstreams $b_1$ and $b_{2d}$ from flip-flop 313 and comparator 312, respectively, and then supplies the sum to the output of the discriminator 101". In this specific embodiment, it is supplied to decimation filter 102 (FIG. 1).

In essence, the multiplexer 308, components 309-314 and delays 304 and 305 constitute a second-order delta-sigma noise shaped phase detector which provides compensation for resolution errors in the first order delta-sigma discriminator formed by divider 301, delays 302 and 303, comparator 306 and delay 307.

In operation, when the selected output signal $x_1$ from multiplexer 308 leads the reference signal $F_{ref}$ for an appropriate number of cycles, the phase detector 309, integrators 310 and 311 and comparator 312 will cause the number of ones in bitstream $b_2$ to increase. As a result, the multiplexer 308 will select inputs 10 and 11, and hence the lagging phase signal from delays 304 and 305 more often. In order to keep the average of the selected output signal $x_1$ phase-locked with the reference signal $f_{ref}$ the selected output signal $x_1$ will therefore lag reference signal $F_{ref}$ more often.

Conversely, when selected output signal $x_1$ lags reference signal $F_{ref}$ by a significant amount, the number of ones in bitstream $b_2$ will decrease causing the multiplexer 308 to select the inputs 01 and 00, and hence the leading phase signals from divider 301 and delay 302, more often. Consequently, the selected output signal $x_1$ will lead the reference signal $F_{ref}$ more often in order to maintain the average selected output signal $x_1$ phase-locked to reference signal $F_{ref}$.

In essence, the use of bitstream $b_2$ as the more significant bit control and the corresponding delayed bitstream $b_{2d}$, delayed by clock cycle, as the least significant bit control, provides a transfer function of $2-z^{-1}$, i.e. the same as the transfer function 205 in the feedback loop of the discriminator shown in FIG. 2.

Figure 4:
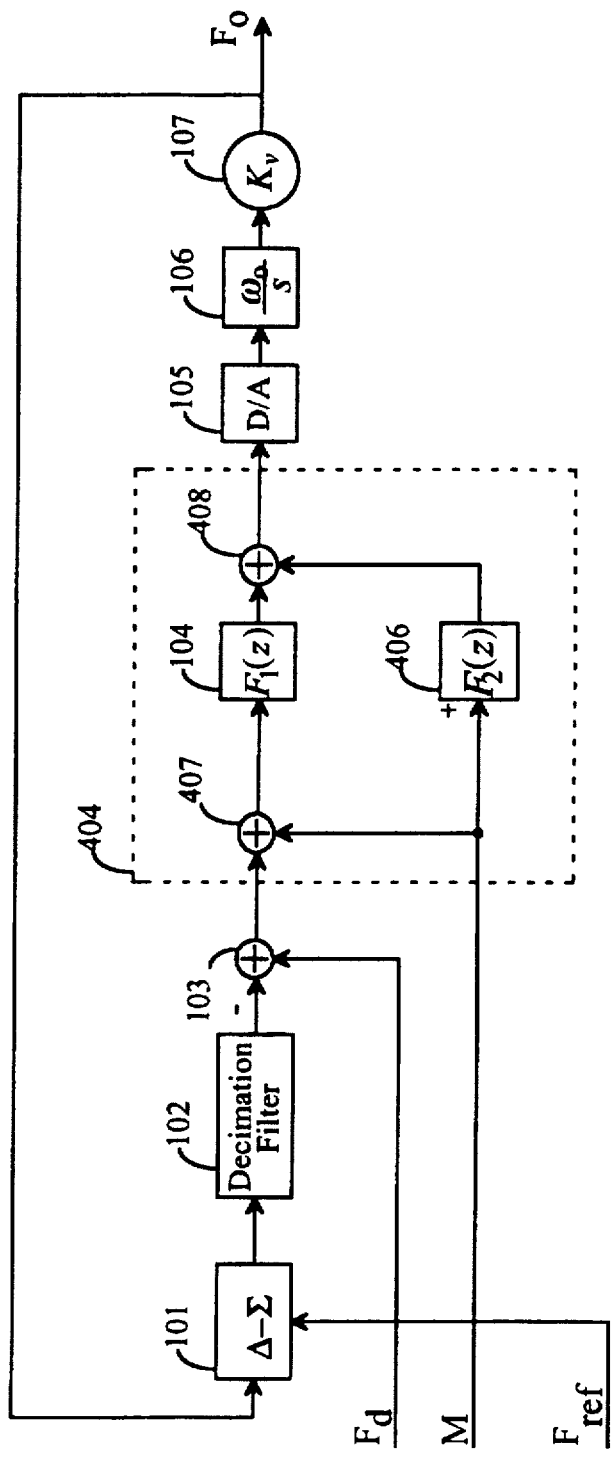
FIG. 4 illustrates a frequency synthesizer which modulates the output signal.
Figure 5:
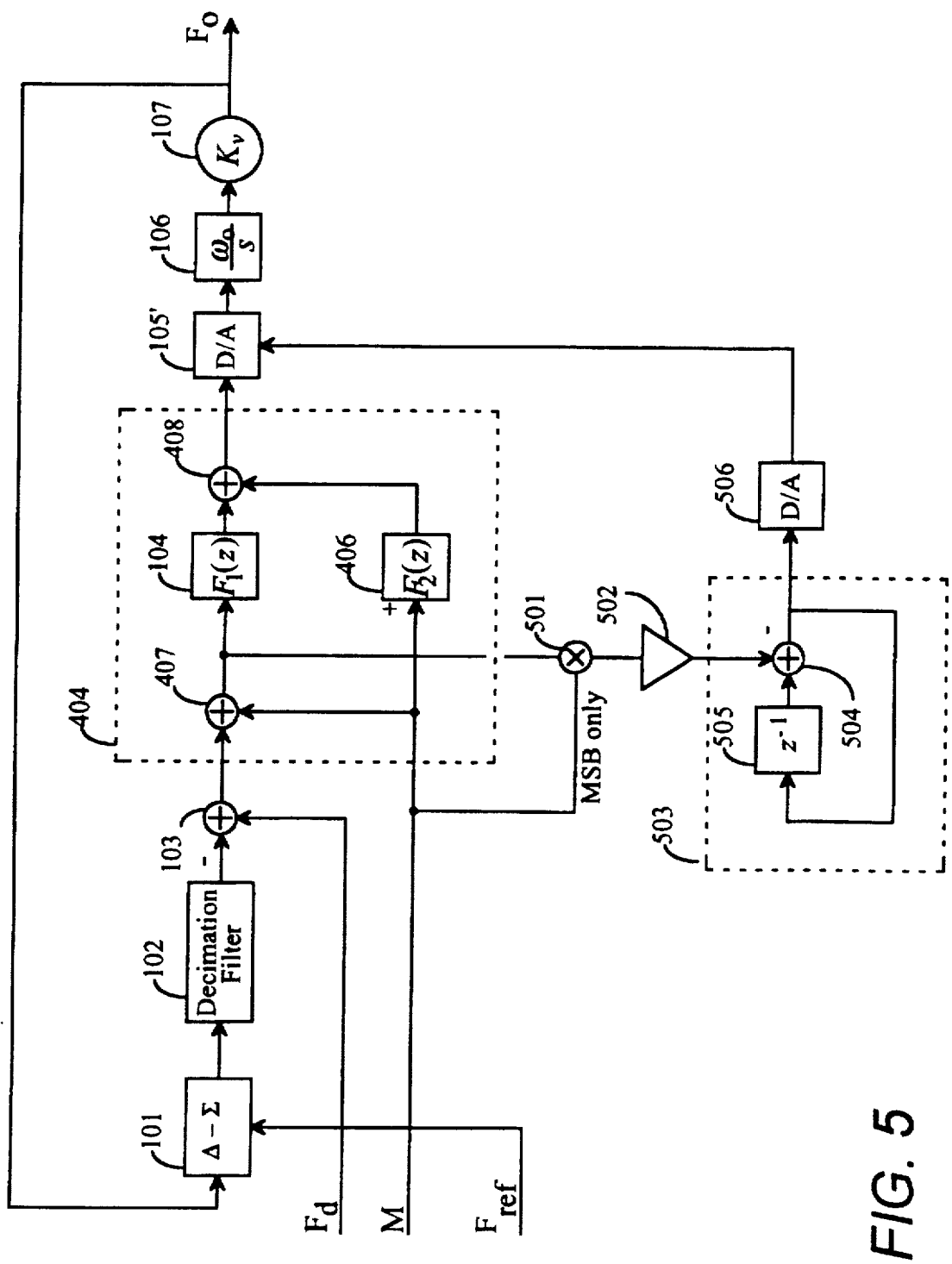
FIG. 5 illustrates a modification to the frequency synthesizer of FIG. 4.

Regardless of which of the discriminators 101, 101' and 101" is used, the frequency synthesizers described above operate with a fixed output frequency $F_o$. Such a synthesizer might be used to provide the local oscillator signal in a radio transmitter which typically would use a mixer to translate a modulated input signal to high frequency or the reverse in a radio receiver. It is desirable to incorporate modulation directly into the frequency synthesizer and hence avoid using a mixer. The embodiment shown in FIG. 1 could do so by modulating the desired signal $F_d$, but this would require the synthesizer to have a loop bandwidth higher than the modulation rate. FIGS. 4 and 5, however, illustrate frequency synthesizers embodying the invention which will permit modulation of the output signal $F_o$ at rates which are outside the loop bandwidth. In FIGS. 4 and 5, components which are identical to components in FIGS. 1 and 2 have the same reference number.

The frequency synthesizer shown in FIG. 4 therefore comprises a delta-sigma discriminator 101 (or 101' or 101"), a decimation filter 102, summing device 103 for subtracting the measured signal $D_o$ from the desired signal frequency $F_d$, a D-to-A converter 105, a filter 106 and a voltage controlled oscillator 107. The loop filter 104, which is the same as the loop filter in FIG. 1, however, is part of an equalization filter means 404 which comprises the loop filter 104, a second filter 406, and two summing devices 407 and 408. As before, loop filter 104 comprises an integrator and a proportional term which removes noise introduced by the delta-sigma discriminator 101 while maintaining stability.

The summing device 407 sums the output of summing device 103 with a 10 bit digital modulation signal M and applies the sum to the input of loop filter 104. The other summing device 408 sums the output of loop filter 104 with the output of second filter 406 and supplies the sum to the D-to-A converter 105. The modulation signal M is also supplied directly to the input of the second filter 406.

In operation, loop filter 104 will permit the phase-locked loop portion of the synthesizer to track the modulation signal M within the bandwidth of the phase-locked loop, thereby allowing modulation of the output signal $F_o$ within the loop bandwidth. Filter 406, however, amplifies higher frequency components of modulation signal M so that the filter 106 does not substantially remove these spectral components from the modulation applied to output signal $F_o$. Hence, the transfer functions of loop filter 104, second filter 406 and the remaining components of the loop are arranged so that, in combination, they provide an all-pass transfer function from the modulation signal input to the output of the synthesizer.

Assuming that:

$K_v$ is the gain of the voltage controlled oscillator 107;

$K_d$ is the gain of the delta-sigma discriminator 101;

$K_D$ is the gain of the decimation filter 102;

$T_d$ is the clock period at the decimation filter output;

I is a scaling factor on the integrator part of the loop filter 104; and

P is a scaling factor on the proportional side of the loop filter 104;

then the transfer function from the modulation signal M to the synthesizer output signal $F_o$ is given approximately by the expression:

$$H_{Mv}(f) = \left. \frac{[F_1(z) + F_2(z)]\frac{1-z^{-1}\omega_1}{s^2} K_v}{1 + [F_1(z) + F_2(z)]\frac{1-z^{-1}\omega_1}{s^2} K_v K_d K_D} \right|_{z=e^{j2\pi fT_D}, s=j2\pi f}$$

where the transfer functions $F_1(z)$ and $F_2(z)$ of loop filter 104 and second filter 406, respectively, are given by the expressions:

$$F_1(z) = \frac{I}{(1-z^{-1})} + P$$

$$F_2(z) = D(1-z^{-1})$$

and D is a scaling factor set to:

$$D = \frac{1}{K_v K_d K_D \omega_1 T_D}$$

Hence, given the gain $K_v$ of voltage controlled oscillator 107, it is possible to design the synthesizer of FIG. 4 so that output signal $F_o$ tracks the modulation signal M over a wide bandwidth, wider than the loop bandwidth.

In some situations, it may be desirable to clock the filter 406 and the D-to-A 105 at the higher clock rate of reference signal $F_{ref}$.

Sometimes, the gain $K_v$ of voltage controlled oscillator 107 is not known precisely and/or varies from one device to another and with temperature. The embodiment of the invention shown in FIG. 5 is a frequency synthesizer similar to that shown in FIG. 4 but modified to compensate for such variations in gain $K_v$ of voltage controlled oscillator 107. The synthesizer of FIG. 5 differs from that shown in FIG. 4, in that a multiplying digital-to-analog converter (MDAC) 105' replaces to D-to-A converter 105 and a multiplier 501, attenuator 502, accumulator 503 formed by a summing device 504 and delay 1-cycle 505, and a further D-to-A converter 506 are added.

The multiplier 501 has its inputs connected to the output of summing device 507 and to the input line 409 so as to correlate the residual error signal $e_r$ and the most significant bit (MSB) of the modulation signal M. (The residual error signal $e_r$ is what remains when the measured signal from decimation filter 102 is subtracted from the desired frequency signal $F_d$ and the modulation signal M.)The multiplier 501 multiplies the most significant bit of modulation signal M by the residual error signal $e_r$ and supplies the product to the attenuator 502 which scales it and supplies it to accumulator 503. The output of accumulator 503 is supplied to D-to-A converter 506, the output of which controls the gain of multiplying digital-to-analog converter (MDAC) 105'.

In operation, the additional components serve to adjust the gain of MDAC 105' to compensate for variations in the gain $K_v$ of voltage controlled oscillator 107, so as to drive the residual error signal $e_r$ to zero.

When gain $K_v$ is too large, the eye of the residual error signal $e_r$ correlates positively with modulation i.e. the measured modulation at the output of decimation filter 102 is too large. As a result, residual error signal $e_r$ is large and the product obtained by multiplying $e_r$ by the most significant bit of modulation signal M in multiplier 501 will be positive. Consequently, the output of accumulator 503 will decrease, causing D-to-A converter 506 to produce a lower voltage thereby reducing the gain of MDAC 105'. The converse will apply when the gain $K_v$ is too low.

Various other modifications of the above-described embodiments are envisaged. For example, the Δ-Σ frequency discriminator 101, 101' or 101" could include a programmable dual-modulus divider enabling the synthesizer to generate a wide range of frequencies. For example, if $F_{ref}$ was 10 MHz and it was desired to generate a signal $F_o$ of 865 MHz or 825 MHz, using the same synthesizer, the value of n would have to change from 86 to 82. A synchronous loadable counter, such as device MC100EO16 by Motorola Inc. with Q6 taken as the divider output, would be suitable.

The frequency discriminator of FIG. 3 is third order. It could be modified to make a second order discriminator by substituting a 2:1 multiplexer, omitting delays 302 and 305 and supplying the outputs of divider 301 and delay 304 to the multiplexer, omitting integrator 311, and using signal $b_2$ alone to control the 2:1 multiplexer. Signal $b_{2d}$ would still be generated for combination with signal $b_1$, but it would not be needed to control the multiplexer.

It should be noted that, in both the second order and third order discriminators, signal $b_1$ is a coarse measurement of signal $F_o$ and signal $b_2$ represents an integral of the error in signal $b_1$. Thus, taking the derivative of $b_2$ and subtracting it from $b_1$ substantially cancels the error in signal $b_1$.

It is also envisaged that embodiments of the invention might use a divider capable of dividing by n or n+δ rather than n or n+1 where δ is a fractional value less than unity. Such a n/n+δ divider can be adapted from that shown in FIG. 4 of Canadian patent number 1,173,515, which is incorporated herein by reference. The divider shown in FIG. 4 of CA 1,173,515 comprises a frequency register, dual modulus divider, and a phase register, and can be adapted by setting the value in the frequency register to F=α or F=α+δ and by using a programmable divider in which the division ratio N can be pre-programmed. To cover a contiguous range of frequencies with such a fractional-δ divider, it is arranged to divide by n+α, or n+α+δ, where α also is a fractional value less than unity.

The delays in tapped delay line 300 could be fractional rather than the integer multiple of the clock period.

It should be appreciated that, although the above-described frequency discriminators are especially suitable for use in the frequency synthesizers disclosed herein, they are not limited to such use, but rather could also be used in other applications.

Various modifications are feasible within the scope of the present invention. For example the bit capacity of the differencing means 103 and the digital-to-analog converter 105 might be reduced for economy. Reductions to eight bits, for example, could introduce additional quantization noise due to the redundant bits, in which case further noise shaping could be added to ensure the stability and phase locking of the frequency synthesizer. Similar considerations apply to any other quantization noise in the decimation filter 102 or the filter 104.

INDUSTRIAL APPLICABILITY

Vulnerability of the analog portions of the circuit, i.e. digital-to-analog converter 105, filter 106 and VCO 107 to external sources of noise and interference can be mitigated by careful design and layout to ensure that power supplies are well decoupled and sensitive signals are shielded appropriately. An advantage of the present invention, however, is that the remaining parts of the frequency synthesizer, being digital, are robust and substantially insensitive to noise and interference. Moreover, most, or all, of the circuit can be fabricated in a single integrated circuit.

Although embodiments of the invention have been described and illustrated in detail, it is to be clearly understood that the same is by way of illustration and example only and is not to be taken by way of limitation, the spirit and scope of the present invention being limited only by the appended claims.

We claim:

1. A frequency synthesizer comprising a voltage controlled oscillator responsive to a control voltage to generate an output signal having a particular frequency, frequency discrimination means responsive to the output signal and a reference signal having a predetermined reference frequency to generate a digital signal representing said particular frequency, differencing means responsive to the digital representation signal and to a digital input signal representing a desired output frequency to provide an error signal and means responsive to the error signal to provide said control voltage, the frequency discrimination means comprising phase-locked loop means phase-locked to the output signal.

2. A frequency synthesizer as claimed in claim 1, wherein the means for providing the control voltage comprises a digital-to-analog converter and filter means is provided between the digital-to-analog converter and the voltage controlled oscillator.

3. A frequency synthesizer as claimed in claim 2, wherein the filter means comprises an analog integrator.

4. A frequency synthesizer as claimed in claim 1, further comprising error signal filter means connected between the differencing means, and the means for providing the control voltage, the error signal filter means comprising an integrator, the arrangement being such that the frequency of the output signal is phase-locked to the reference signal frequency.

5. A frequency synthesizer as claimed in claim 3, further comprising a second integrating filter means connected between the differencing means and the digital-to-analog converter, one of the first and second filter means providing a stabilizing zero.

6. A frequency synthesizer as claimed in claim 5, wherein the second filter means comprises a first summing means with a feedback delay connected between its output and one input and a second summing means having its inputs connected to the input and output, respectively, of the first summing means and its output connected to the digital-to-analog converter, the second summing means providing the stabilizing zero.

7. A frequency synthesizer as claimed in claim 1, wherein the frequency discrimination means comprises a delta-sigma frequency discriminator and a decimation filter is provided between an output of the delta-sigma frequency discriminator and the differencing means.

8. A frequency synthesizer as claimed in claim 1, wherein the phase-locked loop means comprises a second or higher order delta-sigma frequency discriminator.

9. A frequency synthesizer as claimed in claim 1, wherein the frequency discrimination means comprises a phase-locked loop means comprising a feedforward path including a multimodulus divider means for dividing the frequency of the output signal in dependence upon a division ratio control signal, comparison means for comparing the divided signal with the reference signal to provide a second error signal, and a feedback path comprising means having a transfer function of $2-z^{-1}$ and responsive to the error signal and the reference signal to provide the division ratio control signal.

10. A frequency synthesizer as claimed in claim 9, wherein the multimodulus divider divides the output signal by a factor selected in dependence upon a division ratio control signal, and applies the divided frequency signal to a phase/frequency detector clocked by the reference signal to provide the second error signal, integrator means for integrating the error signal, and quantizing means for sampling the integrated error signal to provide said bitstream.

11. A frequency synthesizer as claimed in claim 1, further comprising a first filter means in a signal path between the differencing means and the digital-to-analog conversion means, a second filter means having its output connected to supply the digital-to-analog converter means, and input means for applying a modulation signal to respective inputs of the first and second filter means, the first and second filter means having respective transfer functions such that modulation of the output signal of the synthesizer in response to the modulation signal is possible for modulation rates above a loop bandwidth of the sinthesizer.

12. A frequency synthesizer as claimed in claim 11, wherein the digital-to-analog converter is adjustable in response to a gain control signal to vary amplification of a converted signal and the frequency synthesizer further comprises means responsive to the modulation signal and to a residual error signal derived as a difference between the modulation signal and the first error signal to provide the gain control signal, the arrangement being such that variations in gain of the voltage controlled oscillator are offset by compensating variations in the gain of the digital-to-analog converter.

13. A frequency synthesizer as claimed in claim 12, wherein the means for providing the gain control signal comprises multiplier means for multiplying the most-significant bit of the modulation signal by the residual error signal, accumulator means for accumulating the output of the multiplier means and a second digital-to-analog converter means responsive to the output of the accumulator means to provide the gain control signal.

14. A frequency synthesizer as claimed in claim 1, wherein the frequency discrimination means comprises multimodulus divider and delay line means for dividing the frequency of a digital signal in dependence upon a division ratio control signal and delaying the resulting signal to provide a first divided signal, at least one leading divided signal leading the first divided signal and at least one lagging divided signal lagging the first divided signal;

comparison means for comparing the first divided signal with a reference signal and providing said division ratio control signal;

selection means for selecting, alternatively, the leading divided signal and the lagging divided signal in dependence upon a signal applied to a selection control input of the selection means;

phase detection means for measuring phase error between the selected signal and the reference signal and providing a corresponding phase error signal;

integrator means for integrating the phase error signal;

quantizing means for quantizing the integrated phase error signal to provide a quantized signal representing error in the division ratio control signal, the quantized signal being applied to said selection control input; and output means for deriving a derivative of the quantized signal and combining the quantized signal derivative and the division ratio control signal for output from the frequency discriminator.

15. A frequency synthesizer as claimed in claim 14, wherein the multimodulus divider and delay line means provides a second leading signal and a second lagging signal, the selection means has a second control input and selects one of the leading signals and lagging signals in dependence upon the state of signals at both of the first and second control inputs; the integration means comprises first and second integrators in series; the frequency discriminator further comprising delay means for delaying the integrated phase error signal and applying the delayed integrated phase control signal to the second control input of the selection means; the output means, with the delay means, serving to differentiate the integrated phase error signal and combine the differentiated signal with the delayed phase error signal and the division ratio control signal.

16. A frequency synthesizer as claimed in claim 14, wherein the multimodulus divider comprises a programmable fractional-N divider capable of dividing by n or n+δ where δ is a fractional value less than unity.

17. A frequency discriminator comprising a feedforward path including a multimodulus divider means for dividing the frequency of a digital signal in dependence upon a division ratio control signal, comparison means for comparing the divided frequency signal with a reference frequency signal to provide an error signal, and a feedback path comprising means providing a transfer function of $2-z^{-1}$ and responsive to the error signal and the reference frequency signal to provide the division ratio control signal.

18. A frequency discriminator comprising a feedforward path including multimodulus divider and delay line means for dividing the frequency of a digital signal in dependence upon a division ratio control signal and delaying the resulting signal to provide a first divided signal, at least one leading divided signal leading the first divided signal and at least one lagging divided signal lagging the first divided signal;

comparison means for comparing the first divided signal with a reference signal and providing said division ratio control signal;

selection means for selecting, alternatively, the leading divided signal and the lagging divided signal in dependence upon a signal applied to a selection control input of the selection means;

phase detection means for measuring phase error between the selected signal and the reference signal and providing a corresponding phase error signal;

integrator means for integrating the phase error signal;

quantizing means for quantizing the integrated phase error signal to provide a quantized signal representing error in the division ratio control signal, the quantized signal being applied to said selection control input; and output means for deriving a derivative of the quantized signal and combining the quantized signal derivative and the division ratio control signal for output from the frequency discriminator.

19. A frequency discriminator as claimed in claim 18, wherein the multimodulus divider and delay line means provides a second leading signal and a second lagging signal, the selection means has a second control input, the selection means selecting one of the leading signals and lagging signals in dependence upon the state of signals at both of the first and second control inputs; the integration means comprises a first and second integrators in series; the frequency discriminator further comprising delay means for delaying the integrated phase error signal and applying the delayed integrated phase control signal to the second control input of the selection means; the output means, with the delay means, serving to differentiate the integrated phase error signal and combine the differentiated signal with the delayed phase error signal and the division ratio control signal.

20. A frequency discriminator as claimed in claim 17, wherein the multimodulus divider comprises a programmable fractional-N divider capable of dividing by n or n+$\delta$ where $\delta$ is a fractional value less than unity.

21. A frequency discriminator as claimed in claim 18, wherein the multimodulus divider comprises a programmable fractional-N divider capable of dividing by n or n+$\delta$ where $\delta$ is a fractional value less than unity.

22. A frequency discriminator as claimed in claim 19, wherein the multimodulus divider comprises a programmable fractional-N divider capable of dividing by n or n+$\delta$ where $\delta$ is a fractional value less than unity.

23. A frequency synthesizer as claimed in claim 15, wherein the multimodulus divider comprises a programmable fractional-N divider capable of dividing by n or n+$\delta$ where $\delta$ is a fractional value less than unity.

* * * * *